United States Patent
Domanski

(10) Patent No.: US 9,548,295 B2
(45) Date of Patent: Jan. 17, 2017

(54) SYSTEM AND METHOD FOR AN INTEGRATED CIRCUIT HAVING TRANSISTOR SEGMENTS

(71) Applicant: Infineon Technologies AG, Neubiberg (DE)

(72) Inventor: Krzysztof Domanski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 539 days.

(21) Appl. No.: 13/625,995

(22) Filed: Sep. 25, 2012

(65) Prior Publication Data
US 2014/0084380 A1 Mar. 27, 2014

(51) Int. Cl.
*H01L 23/62* (2006.01)
*H01L 27/02* (2006.01)
*H01L 27/06* (2006.01)

(52) U.S. Cl.
CPC ....... *H01L 27/0259* (2013.01); *H01L 27/0623* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 5,021,853 A | 6/1991 | Mistry | |
| 5,229,635 A * | 7/1993 | Bessolo | H01L 27/0251 257/357 |
| 5,754,380 A | 5/1998 | Ker et al. | |
| 5,986,867 A | 11/1999 | Dubbury et al. | |
| 6,125,021 A | 9/2000 | Duvvury et al. | |
| 6,744,107 B1 | 6/2004 | Ker et al. | |
| 6,914,305 B2 | 7/2005 | Kwon et al. | |
| 7,005,708 B2 | 2/2006 | Mergens et al. | |
| 7,851,872 B2 | 12/2010 | Sutardja | |
| 2006/0088958 A1 | 4/2006 | Balakrishnan | |
| 2010/0219476 A1* | 9/2010 | Lee | H01L 27/0266 257/355 |
| 2012/0176710 A1* | 7/2012 | Domanski | H01L 27/0285 361/56 |
| 2012/0219476 A1* | 8/2012 | Virnig | C22B 3/0017 423/9 |

FOREIGN PATENT DOCUMENTS

CN 1426108 A 6/2003

* cited by examiner

*Primary Examiner* — Ali Naraghi
(74) *Attorney, Agent, or Firm* — Slater Matsil, LLP

(57) ABSTRACT

In accordance with an embodiment, an integrated circuit has a first transistor made of a plurality of first transistor segments disposed in a well area, and a second transistor made of at least one second transistor segment. Drain regions of the plurality of first transistor segments and the at least one second transistor segment are coupled to a common output node. The at least one second transistor segment is disposed in the well area such that an electrostatic discharge pulse applied to a common output node homogenously triggers parasitic bipolar devices coupled to each drain region of the plurality of first transistor segments and the drain region of the at least one second transistor segment.

32 Claims, 8 Drawing Sheets

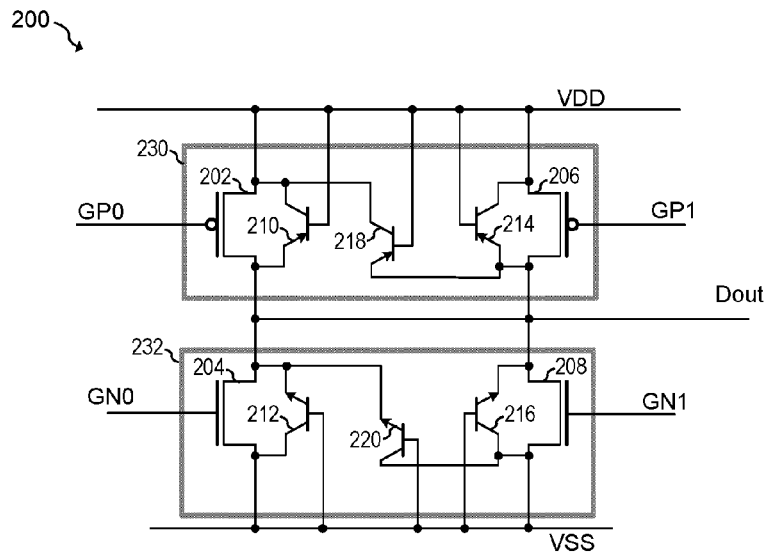
FIG. 2a
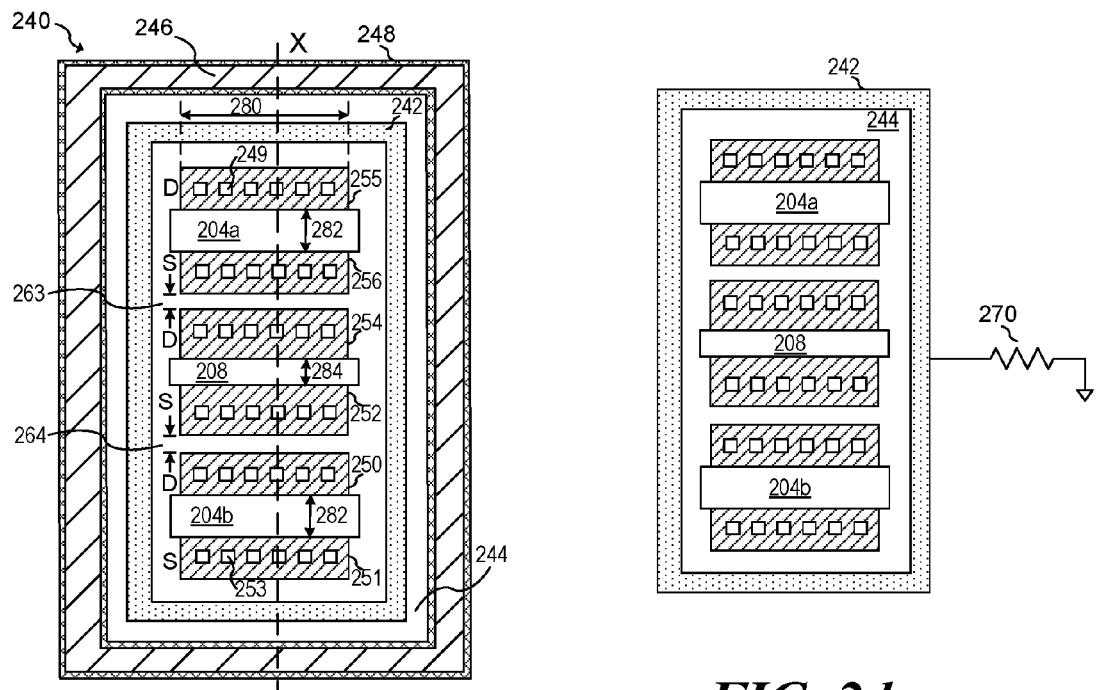
FIG. 2b
FIG. 2d

SYSTEM AND METHOD FOR AN INTEGRATED CIRCUIT HAVING TRANSISTOR SEGMENTS

TECHNICAL FIELD

This invention relates generally to semiconductor circuits and methods, and more particularly to a system and method for an integrated circuit having transistor segments.

BACKGROUND

Variable strength output drivers are used in a variety of electronic devices. For example, in some memory systems, a driver with an adjustable drive strength may be used to match the capacitance of the address lines being driven, or to adjust the response times of the driven signals. Integrated circuits (ICs) may also contain variable strength output drivers to provide more flexibility in their target application. For example, a single general purpose IC may utilize a variable strength output driver to allow it to be used on a circuit board having a low parasitic load, or in a system having requiring a high drive strength. By adjusting the drive strength of a particular output driver to match the requirements of the target application, power consumption may be optimized and RF emissions caused by unnecessarily fast edge transitions may be reduced.

Variable strength output drivers may be implemented using parallel output drivers that are selectively activated according to a desired drive strength. These parallel output drivers may have different drive strengths, different gate lengths and different gate widths for each parallel output drive stage. In many cases, these variable strength output drivers are included in input/output (I/O) cells disposed near the periphery of the integrated circuit.

Such variable strength output drivers pose some difficulties with respect to sensitivity to electrostatic discharge (ESD). In the event of an ESD pulse at an I/O pin coupled to an output of the variable strength driver, selected parallel output device elements may conduct high ESD currents, while deselected elements may maintain a high impedance, thereby causing only a subset of the parallel output devices to handle large ESD currents. One way in which this issue has been addressed is by attaching ESD protection devices to the I/O pin coupled to the output of the variable strength driver.

SUMMARY OF THE INVENTION

In accordance with an embodiment, an integrated circuit has a first transistor made of a plurality of first transistor segments disposed in a well area, and a second transistor made of at least one second transistor segment. Drain regions of the plurality of first transistor segments and the at least one second transistor segment are coupled to a common output node. The at least one second transistor segment is disposed in the well area such that an electrostatic discharge pulse applied to a common output node homogenously triggers parasitic bipolar devices coupled to each drain region of the plurality of first transistor segments and the drain region of the at least one second transistor segment.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2a-d illustrate embodiment implementations of an adjustable strength output driver;

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely an adjustable strength output driver. Embodiments of the present invention are not limited to adjustable strength output drivers, and may also be applied to other types of circuits, for example, interface circuits susceptible to electrostatic discharge (ESD) events.

Figure 1A:
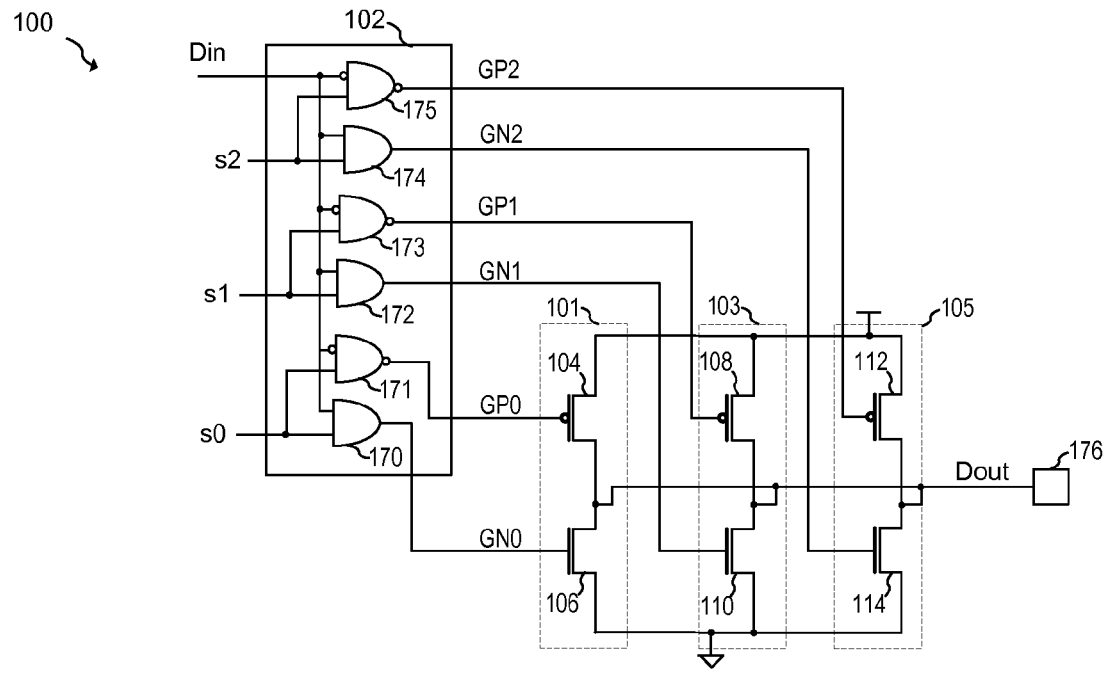
FIG. 1a illustrates a schematic diagram of an adjustable strength output driver.

FIG. 1a illustrates adjustable output driver 100 according to an embodiment of the present invention. In the depicted embodiment, driver 100 has three parallel driver stages 101, 103 and 105. Each stage has an NMOS device and a PMOS device. For example, stage 101 has PMOS device 104 and NMOS device 106; stage 103 has PMOS device 108 and NMOS device 110; and stage 105 has PMOS device 112 and NMOS device 114. The output of each stage is coupled to output signal Dout, which is coupled to output pad 176. In an embodiment, NMOS and PMOS devices in stages 101, 103 and 105 may have different gate lengths and different gate widths depending on the application and its particular specifications.

In some embodiments, the PMOS and NMOS devices of each of stages 101, 103 and 105 are driven with separate gate drive signals so that each stage may be activated or deactivated. For example, gate drive control circuit 102 generates control signals GN0 and GP0 for NMOS device 106 and PMOS device 104 in stage 101; GN1 and GP1 for NMOS device 110 and PMOS device 108 in stage 103; and GN2 and GP2 for NMOS device 112 and PMOS device 114 in stage 105. In an embodiment, these gate drive signals may be generated using logic gates 170, 171, 172, 173, 174 and 175 based on gate drive input signal Din and select signals s0, s1 and s2. For example, when select signal s0 is active, stage 101 is active; when select signal s1 is active, stage 103 is active; and when select signal s2 is active, stage 105 is active. It should be appreciated that output driver 100 is just one example of many different adjustable strength output driver configurations. For example, in alternative embodiments of the present invention, output driver 100 may have greater or fewer parallel output stages, and control circuit 102 may be implemented using different logic structures that are either logically equivalent to the structure shown in FIG. 1a or perform different logical functions.

Figure 1B:
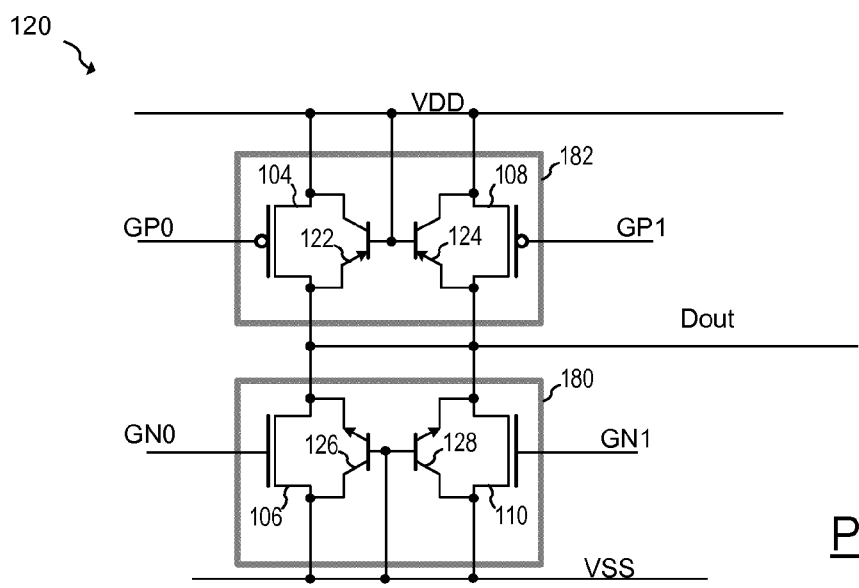
FIGS. 1b-d illustrate prior art implementations of an adjustable strength output driver.

FIG. 1b illustrates equivalent circuit 120 of a conventional adjustable output driver. Equivalent circuit 120 has a first output driver having PMOS transistor 104 and NMOS transistor 106; and second output driver having PMOS transistor 108 and NMOS transistor 110. Box 182 represents the n-well in which PMOS devices 104 and 108 are disposed, and box 180 represents the p-well in which NMOS devices 106 and 110 are disposed. Each of these MOS devices has a corresponding parasitic bipolar device having a base made of the particular well in which the device is disposed and collectors and emitters made of the source/drain contacts of the corresponding MOS device. As shown, PMOS device 104 is coupled to parasitic bipolar device 122, PMOS device 108 is coupled to parasitic bipolar device 124, NMOS device 106 is coupled to parasitic bipolar device 126 and NMOS device 110 is coupled to parasitic device 128.

In the case of an ESD event at node Dout, one or more of parasitic bipolar devices 122, 124, 126 and 128 may be activated depending on the states of gate drive signals GN0, GP0 and GN1 and GP1. For example if signal GN0 is active and GN1 is not active, an ESD event at node Dout may turn on parasitic bipolar device 126 coupled to NMOS device 106, but not turn on parasitic bipolar device 128 coupled to NMOS device 110. As such, extra stress may be placed on NMOS device 106 during the ESD event that may cause device failure. In some cases, devices having the smaller gate length may trigger first, while devices having a longer gate length do not trigger at all. Such an inhomogenous conduction causes a high on-resistance of the device under ESD stress, and may lead to the thermal destruction of the device before the current is driven through all the MOS devices having different gate length. This may further affect clamping capabilities and the maximal current through the device under ESD.

Figure 1C:
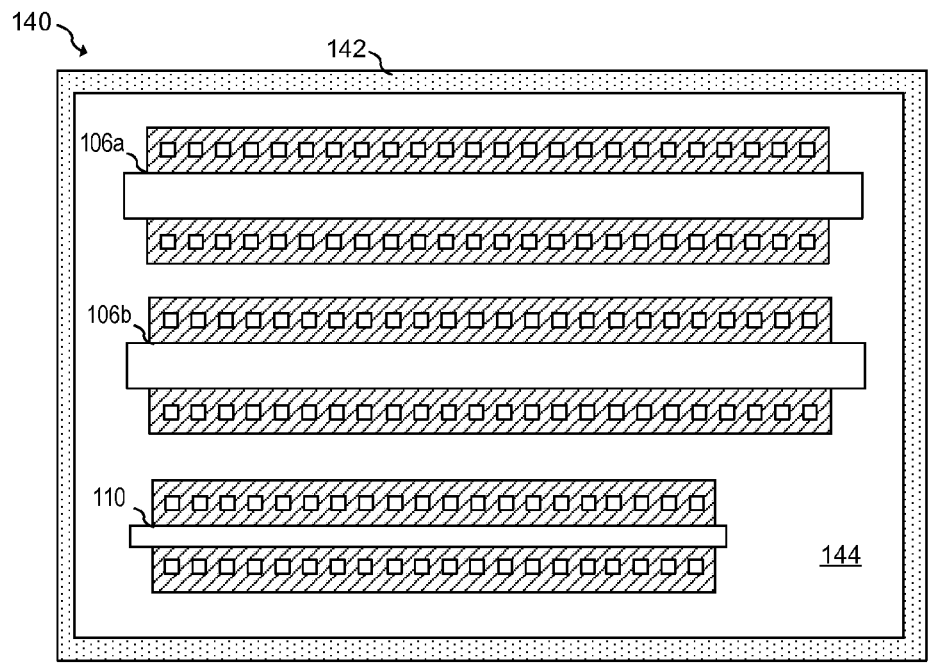
Figure 1D:
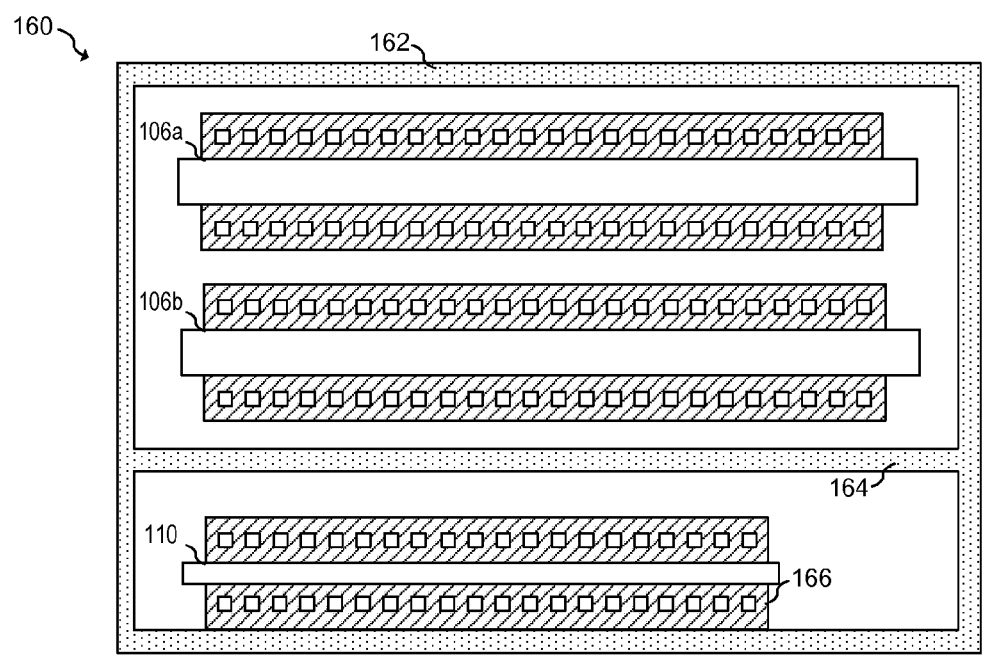

FIG. 1c illustrates conventional layout 140 of NMOS devices 106 and 110. As shown, NMOS device 106 is divided into two wide sub-devices 106a and 106b and NMOS device 110 is laid out as a single device in p-well 144, which is surrounded by p+ guard ring 142. FIG. 1d illustrated another conventional driver layout 160, in which NMOS device segment 110 is surrounded by p+ guard ring 162 as well as guard ring segment 164. Source region 166 is disposed adjacent to p+ guard ring 162.

In an embodiment, the ESD robustness of multiple MOS devices connected directly to an I/O pad may be increased by segmenting devices into multiple segments and arranging the devices such that a segment of one transistor is disposed next to a segment of another transistor such that the drain of one segment is placed adjacent to a source of the other segment. As such, a further parasitic bipolar device is introduced that triggers adjacent device segments, thereby causing a more uniform triggering among all devices.

In an embodiment, multiple NMOS or PMOS devices coupled to an output pad are segmented into a plurality of fingers connected in parallel. Segments representing multiple devices may be arranged in various patterns including, for example, a sparse pattern, a checkerboard pattern, a random pattern as well as others. Segments of NMOS and/or PMOS devices may be further arranged in an array. Each of these segments may be placed in an exchangeable manner. Furthermore, the devices in a grid layout may be laid out in various shapes including, but not limited to, squares, rectangles and L-shapes.

In order to further provide homogeneous triggering, the each array of NMOS or PMOS devices may be disposed within a common guard ring. In some embodiments, this common guard ring may be coupled to its respective supply node via a resistor. The resistor may be used to increase the impedance of the well enclosed within the guard ring, thereby enhancing the triggering of the parasitic bipolar transistors. In some embodiments, this resistor may have a value of between about 100Ω and about 10 kΩ. Alternatively, other resistance values outside of this range may be used.

FIG. 2a illustrates equivalent circuit 200 of an adjustable output driver. Equivalent circuit 200 has a first output driver having PMOS transistor 202 and NMOS transistor 204; and second output driver having PMOS transistor 206 and NMOS transistor 208. Box 230 represents the n-well in which PMOS devices 202 and 206 are disposed, and box 232 represents the p-well in which NMOS devices 204 and 208 are disposed. Each of these MOS devices has a corresponding parasitic bipolar device having a base made of the particular well in which the device is disposed and collectors and emitters made of the source/drain contacts of the corresponding MOS device. As shown, PMOS device 202 is coupled to parasitic bipolar device 210, PMOS device 206 is coupled to parasitic bipolar device 214, NMOS device 204 is coupled to parasitic bipolar device 212 and NMOS device 208 is coupled to parasitic device 216. In addition, parasitic bipolar device 218 is coupled between the source of PMOS device 202 and the drain of PMOS device 206; and parasitic bipolar device 220 is coupled between the drain of NMOS device 204 and the source of NMOS device 208. Parasitic devices 218 and 220 are formed, for example, as a function of embodiment layouts.

In the case of an ESD event at node Dout, one or more of parasitic bipolar devices 210, 212, 214 and 216 may be directly activated depending on the states of gate drive signals GN0, GP0 and GN1 and GP1. In addition, parasitic bipolar devices 218 and 220 may trigger an adjacent device segment. For example, even if parasitic bipolar device 216 coupled to NMOS device 208 is not fully triggered, parasitic bipolar device 216 may still be triggered via parasitic bipolar device 220.

FIG. 2b illustrates embodiment layout 240 corresponding to NMOS devices 204 and 208 shown in FIG. 2a. In an embodiment, NMOS device 204 is laid out in two segments 204a and 204b; and NMOS device 208 is laid out in a single segment. NMOS device segments 204a, 204b and NMOS device 208 have device widths denoted by dimension 280, NMOS device segments 204a and 204b have gate lengths denoted by dimension 282, and NMOS device 208 has a gate length denoted by dimension 284. In alternative embodiments, device segments may have device widths and gate lengths different from what is illustrated in FIG. 2b.

In an embodiment, drain region 255 of device segment 204a, drain region 250 of device segment 204a and drain region 254 of device 208 may be coupled to a common output node of an adjustable strength driver via drain contacts 249. Further, source region 256 of device segment 204a, source region 251 of device segment 204a and source region 252 of device 208 may be coupled to a power supply node, such as a ground node. In other embodiments, source regions 251, 252 and 256 may be coupled to a positive or negative power supply node. Connections to source contacts 253 and drain contacts 249 may be made using, for example, conductive layers on the integrated circuit.

As shown, the drain region 254 of device 208 is disposed adjacent to source region 256 of device segment 204a at distance 263. Likewise, source region 252 of device 208 is disposed adjacent to drain region 250 of device segment 204 at distance 264. Distances 263 and 264 may correspond with a minimum distance between source and drain regions according to the particular technology used. In some embodiments, distances greater than a minimum distance may be used to control the ESD triggering of the devices. Distances 263 and 264 may be a same or a different distance. In an embodiment, distances 263 and 264 may be between about 0.1 μm and about 10 μm; however other distances may be used.

Furthermore, in some embodiments, transistors are segmented into segments that are between about 5 μm and about 10 μm wide, as designated by dimension 280. Alternatively, segment widths greater or less than this range may also be used. For example, in some embodiments, a segment width of 3 μm may be used. By using narrower segment widths, a faster driver device may result because of the lower RC time constant associated with smaller gate lengths (i.e. a shorter gate length has a lower series resistance). Gate lengths for devices 204a and 204b are designated by dimension 282 and the gate length for device 284 is designated by dimension 284.

In an embodiment, device segments 204a, 204b and 208 are arranged in p-well 244 and surrounded by p+ guard ring 242. In some embodiments, p+ guard ring 242 may be further surrounded by n+ guard ring 246 disposed in n-well 248.

In some embodiments of the present invention, segments 204a, 204b and 208 may be laid out with elongated drain regions that are longer than a minimum length of a particular process technology and/or using silicide blocking on the source and/or drain regions to provide ballasting and to provide further current limiting in the case of an ESD event. Other output device layout techniques known in the art may be applied to the layout of these segments.

Figure 2C:
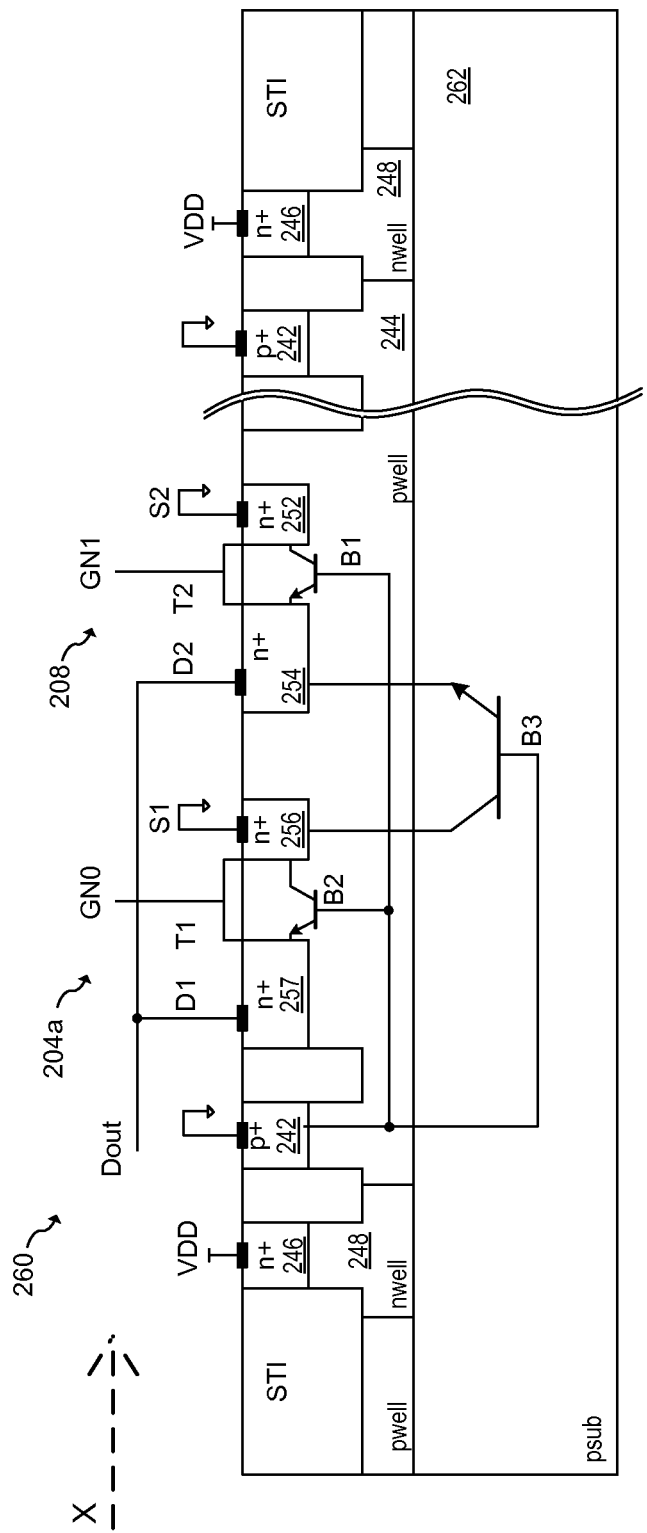

FIG. 2c illustrates cross-section 260, which is taken at cross-section line X shown in FIG. 2b. FIG. 2c illustrates the relationship between parasitic bipolar devices B1, B2 and B3 and NMOS devices segments 204A and 208. In an embodiment, parasitic bipolar device B1 is formed having an emitter at drain region 254 of device segment 208, a collector at source region 252 of NMOS device 208. Similarly, parasitic bipolar device B2 is formed having an emitter at drain region 257 of device 204a, a collector at source region 256 of NMOS device segment 204a. The bases of parasitic bipolar devices B1 and B2 are formed by p-well 244 and are coupled to ground p+ guard ring region 242. Furthermore, parasitic bipolar device B3 has an emitter at drain region 254 of device segment 208, a collector at source region 256 of device segment 204a, and a base formed by p-well 244 and p-substrate 262.

FIG. 2d illustrates an embodiment layout of NMOS devices in which p+ guard ring is grounded via resistor 270. In an embodiment, resistor 270 may have a resistance of between about 100Ω and about 10 kΩ. Alternatively, other resistance values outside of this range may be used.

Figure 3A:
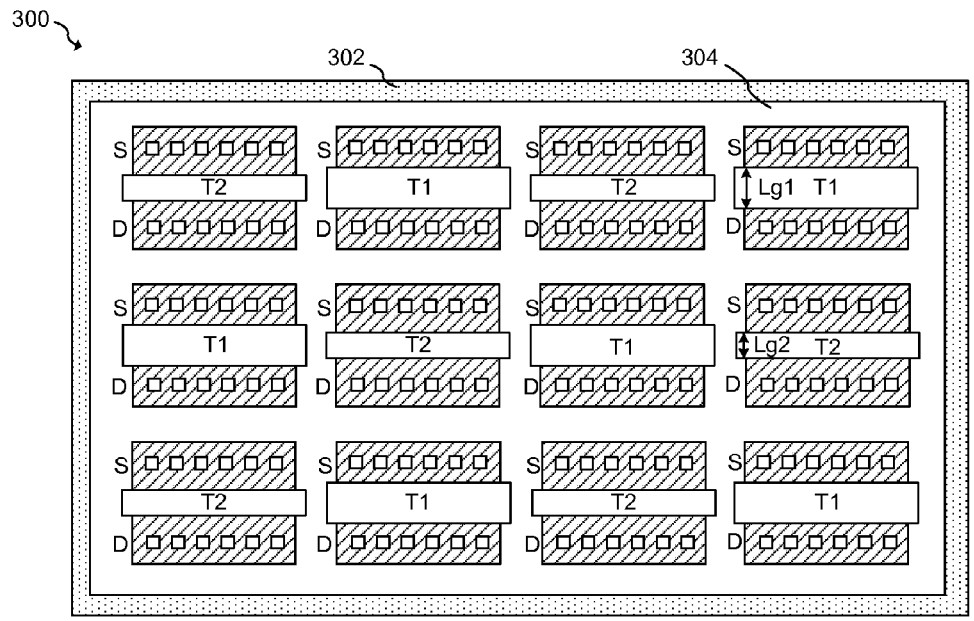
FIGS. 3a-c illustrate embodiment layout diagrams of adjustable strength output drivers.

FIG. 3a illustrates embodiment layout 300 in which a first transistor is segmented into transistor segments labeled "T1" and a second transistor is segmented into segments labeled "T2." Layout 300 may be used to implement NMOS transistors 204 and 208 shown in FIG. 2a such that transistor segments T1 implement NMOS transistor 204 and transistor segment T2 implements NMOS transistor 208. As shown, segments T1 and T2 are arranged in a checkerboard pattern with the source region of a T1 device segment disposed adjacent a drain region of a T2 device segment, and the drain region of a T1 device segment disposed adjacent to a source region of a T2 device segment along the width of a segment. In the illustrated embodiment, T1 device segments have a gate length Lg1 and T2 device segments have a gate length Lg2. All device segments are disposed within well 304 and surrounded by guard ring 302. Device segments T1 and T2 may be implemented using NMOS devices, in which case well 304 is a p-well and guard ring 302 is a p+ guard ring; or using PMOS devices, in which case well 304 is a n-well and guard ring 302 is a n+ guard ring.

Figure 3B:
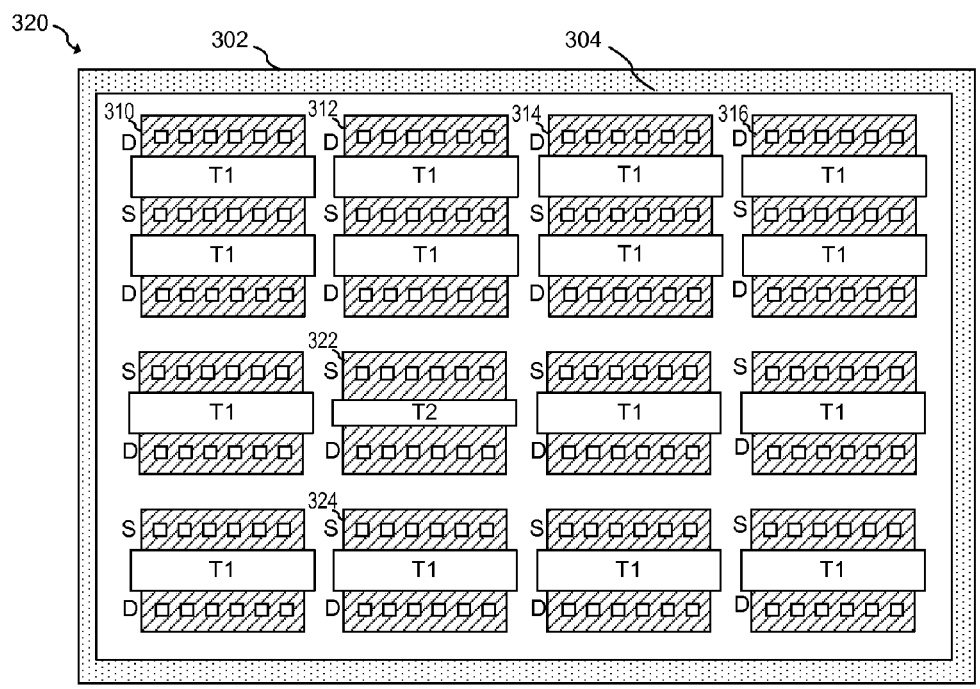

FIG. 3b illustrates further embodiment layout 320. Similar to layout 300 in FIG. 3a, a first transistor is segmented into transistor segments labeled "T1" and a second transistor is segmented into segments labeled "T2." Segmented units 310, 312, 314 and 316 contain two T1 segments that share a common source diffusion. Layout 320 has a single T2 device segment 322 that includes a source diffusion region disposed adjacent to a drain region of segmented unit 312 and a drain region disposed adjacent to the source region of T1 device segment 324. Layout 320 is allows for a more compact layout in cases where one transistor has many more device segments than another device segments. In alternative embodiments, more than one T2 device segment may be used. In some embodiments, less populous device segments may be sparsely disposed within the array.

Figure 3C:
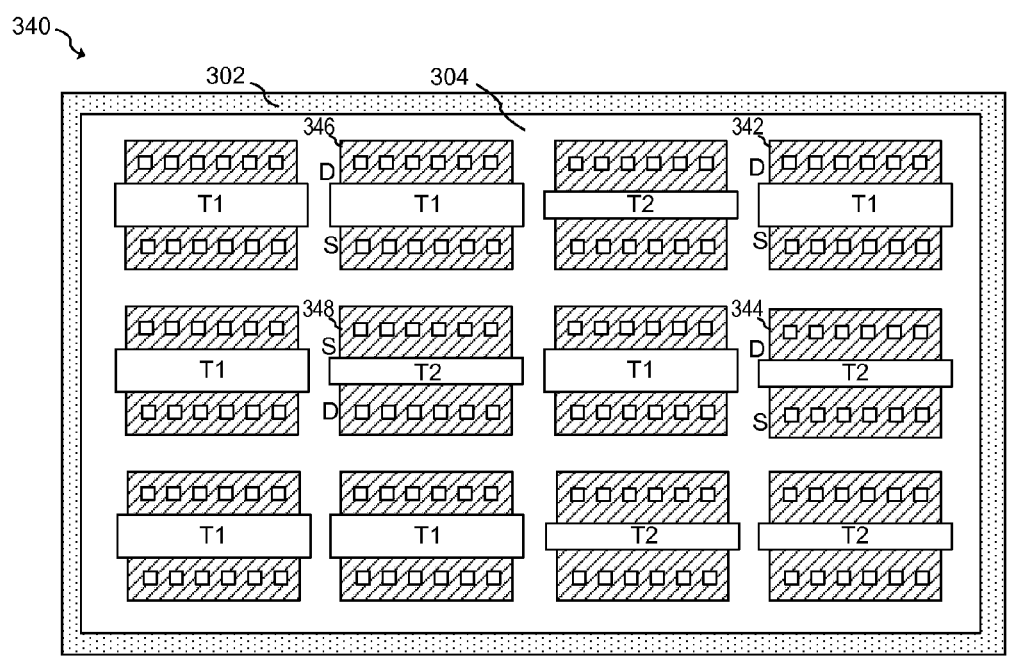

FIG. 3c illustrates embodiment layout 340 in which first transistor segments T1 and second transistor segments T2 are distributed in a random fashion; both in terms of location and in orientation. For example, the source region of T1 device 346 is disposed adjacent to the source region of T2 device 348; however, the source region of T1 device segment 342 is disposed adjacent to the drain region of T2 device segment 344. In alternative embodiments, first transistor segments T1 and second transistor segments T2 may distributed with respect to location only, such that the source region of one transistor segment is adjacent to a drain region of another transistor segment.

Figure 4A:
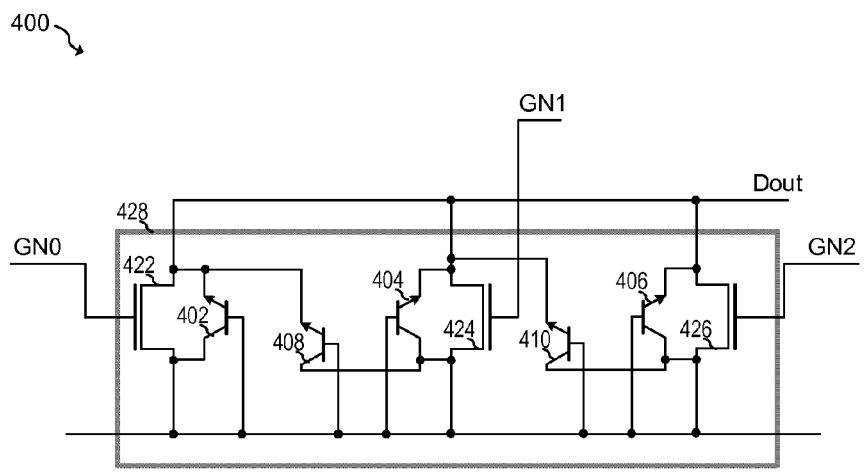
FIGS. 4a-b illustrate an adjustable strength output driver according to a further embodiment.

FIG. 4a illustrates equivalent circuit 400 of NMOS devices 422, 424 and 426 of an adjustable output driver. The gates of NMOS devices 422, 424 and 426 are coupled to gate drive signals GN0, GN1 and GN2 respectively. Box 428 represents the p-well in which NMOS devices 422, 424 and 426 are disposed. Each of these NMOS devices has a corresponding parasitic bipolar device having a base made of the particular p-well 428 in which the device is disposed and collectors and emitters made of the source/drain contacts of the corresponding NMOS device. As shown, NMOS device 422 is coupled to parasitic bipolar device 402; NMOS device 424 is coupled to parasitic device 404; and NMOS device 426 is coupled to parasitic device 406. In addition, parasitic bipolar device 408 between the drain of NMOS device 422 and the source of NMOS device 424; and parasitic bipolar device 410 between the drain of NMOS device 424 and the source of NMOS device 426. It should be appreciated that in alternative embodiments, equivalent circuit 400 may have any number of NMOS transistors coupled to any number of corresponding gate drive signals. In alternative embodiments, multiple PMOS transistors may also be arranged to have corresponding parasitic bipolar transistors.

Figure 4B:
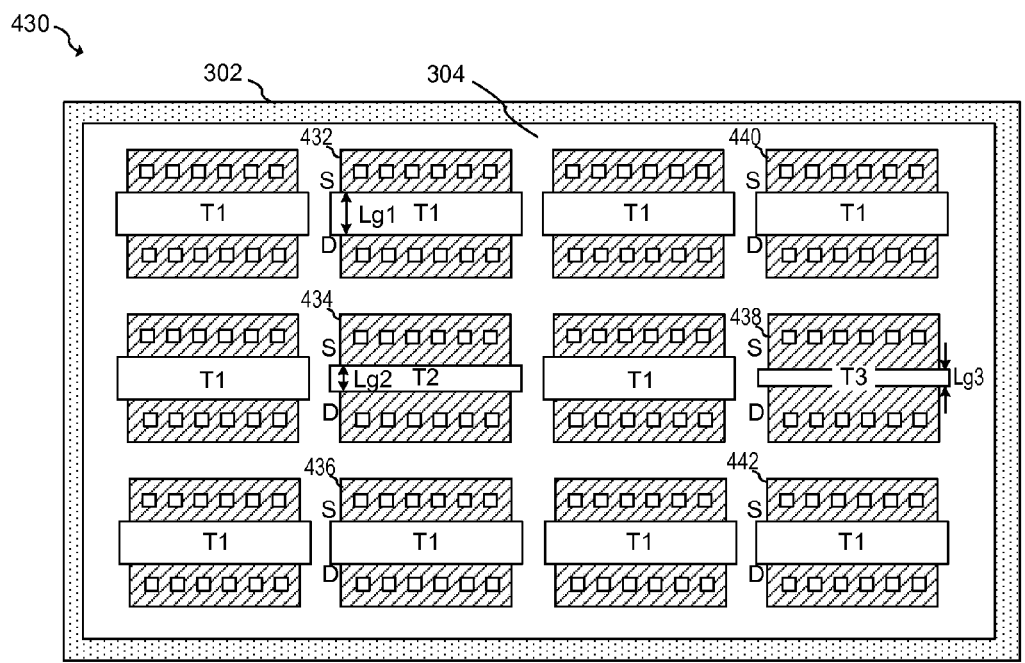

FIG. 4b illustrates embodiment layout 430 in which a first transistor is segmented into transistor segments labeled "T1" a second transistor is segmented into a segment labeled "T2," and a third transistor is segmented into a segment labeled "T3." Layout 430 may be used to implement NMOS transistors 422, 424 and 426 shown in FIG. 2a such that transistor segments T1 implement NMOS transistor 422, transistor segment T2 implements NMOS transistor 424, and transistor segment T3 implements transistor 426. As illustrated, transistor segments T1, T2 and T3 have different gate lengths Lg1, Lg2 and Lg3, respectively. Alternatively, two more of segments T1, T2 and T3 may have a same gate length. In an embodiment, T2 device segment 434 has a source region disposed adjacent to the drain region of T1 device segment 432, and has a drain region disposed adjacent to the drain region of T1 device segment 436. Likewise, T3 device segment 438 has a source region disposed adjacent to the drain region of T1 device segment 440, and has a drain region disposed adjacent to the drain region of T1 device segment 442. It should be appreciated that the transistor array shown in FIG. 4b is just one example of many possible embodiments. For example, in alternative embodiments, segments that correspond to less than or greater than three transistors may be utilized in the array. It should be further appreciated that while the embodiments shown herein are have specific device array sizes, for example, the embodiments, of FIGS. 3a-c and 4b illustrate 3×4 device arrays, alternative embodiments may utilize other array dimensions.

In accordance with an embodiment, an integrated circuit includes a first transistor having a plurality of first transistor segments disposed in a well area. Each first transistor segment has a first source region coupled to a power supply node, a first drain region coupled to a common output node, and a first gate region coupled to a first input node. The integrated circuit also includes a second transistor having at least one second transistor segment. The at least one second transistor segment has a second source region coupled to the power supply node, a second drain region coupled to the common output node, and a second gate region coupled to a second input node, which is different from the first input node. Furthermore, the at least one second transistor segment is disposed in the well area such that an electrostatic discharge pulse applied to the common output node homogenously triggers parasitic bipolar devices coupled to each first drain region of the plurality of first transistor segments and the second drain region of the at least one second transistor segment.

In an embodiment, the second drain region of the at least one second transistor segment may be disposed adjacent to the first source region of one of the plurality of first transistor segments, or the second source region of the at least one second transistor segment may be disposed adjacent to the first drain region of one of the plurality of first transistor segments. The integrated circuit may further include a third transistor having at least one third transistor segment disposed in the well area adjacent to a further first transistor segment of the plurality of first transistor segments. In this case, the third transistor segment has a third gate region coupled to a third input node different from the first and second input nodes, a third drain region coupled to the common output node, and a third source region coupled to the power supply node. The third drain region of the at least one third transistor segment may be disposed adjacent to the first source region of a further one of the plurality of first transistor segments. Alternatively, the third source region of the at least one third transistor segment may be disposed adjacent to the first drain region of the further one of the plurality of first transistor segments.

In an embodiment, the integrated circuit further includes an output pad coupled to the common output node. The plurality of first transistor segments and the at least one second transistor segment may further include NMOS transistors, such that the well area comprises a p-well, the first drain region, first source region, second drain region and second source region comprises n+ regions, and power supply node is a ground node. Alternatively, the plurality of first transistor segments and the at least one second transistor segment may be PMOS transistors, where the well area is a n-well, and the first drain region, first source region, second drain region and second source region are p+ regions.

In an embodiment, the integrated circuit further includes a first guard ring surrounding the well area, such that the first guard ring has a same conductivity type as the well area. This guard ring may be coupled to the power supply node via a resistor that has a resistance value, for example, between about 100 ohms and about 10 K ohms. In an embodiment, the plurality of first transistor segments may a different gate length from the at least one second transistor segment.

In an embodiment, the integrated circuit further includes at least one further second transistor segment, such that the second transistor segments are sparsely distributed among the plurality of first transistor segments. The second transistor segments may be further randomly distributed among the plurality of first transistor segments.

In some embodiments, the integrated circuit also includes a third transistor having at least one third transistor segment disposed in the well area adjacent to a one of the plurality of first transistor segments. The third transistor segment has a third gate region coupled to a third input node different from the first and second input nodes, a third drain region coupled to the common output node, and a third source region coupled to the power supply node. The first source region of a one of the plurality of first transistor segments may be disposed next to the third drain region of the third transistor segment and separated by a third distance, or the first drain region a one of the plurality of first transistor segments may be disposed next to the third source region and separated by a fourth distance.

In accordance with a further embodiment, a semiconductor circuit includes a first transistor having a plurality of first transistor segments disposed in a well region, such that each of the first plurality of transistor segments comprising a first gate coupled to a first gate input node. A first transistor segment of the plurality of first transistor segments is disposed in the well region, and includes a first source region coupled to a power supply node and a first drain region coupled to a common output node. The semiconductor circuit further includes a second transistor segment disposed in the well region. The second transistor segment includes a second source region coupled to the power supply node, a second drain region coupled to the common output node and a second gate coupled to a second gate input node different from the first gate input node. The second drain region of the second transistor segment may be disposed adjacent to the first source region of the first transistor segment of the plurality of first segments at a first distance. Also included is a third transistor segment disposed in the well region. The third transistor segment has a third source region coupled to the power supply node, and a third drain region coupled to the common output node, such that the third drain region of the third transistor segment is disposed adjacent to the second source region of the second transistor segment at a second distance. The third transistor segment may be one of the plurality of first transistor segments in some embodiments, and may further includes a third gate coupled to a third gate input node. In an embodiment, the third gate input node is different from the first and second gate input nodes.

In some embodiments, the plurality of first transistor segments and the second transistor segment are arranged in an array having a dimension of at least 2×3. In addition, a first transistor segment of the plurality of first transistor segments, the second transistor segment and the third transistor segment may have a same first width. This same first width may be between about 5 μm and about 10 μm. However, widths outside this range may also be used. In some embodiments, the first distance and the second distance are a same distance.

In accordance with a further embodiment, an integrated circuit includes an output pad and a plurality of MOS transistors disposed in a well region. The plurality of MOS transistors have drain regions coupled to the output pad, source regions coupled to a power supply node, and gates coupled to a plurality of different corresponding gate input nodes. In an embodiment, the plurality of MOS transistors are segmented into segments of a first width, and the segments are arranged in an array within the well region. This array may have a dimension of at least 3×3; however, smaller array dimensions may also be used. In an embodiment, a first segment of a first MOS transistor of the plurality of MOS transistors and a second segment of a second MOS transistor of the plurality of MOS transistor are arranged with a source region of the first segment adjacent to a drain region of the second segment separated by a first distance. In some embodiments, the first width is between about 5 μm and about 10 μm, and first distance is between about 0.1 μm and about 10 μm. The integrated circuit may also include a gate control circuit coupled to the plurality of different corresponding gate input nodes.

In an embodiment, the plurality of MOS transistors are NMOS transistors and the well region is a p-well region. Furthermore, at least one of the plurality of MOS transistors may have a gate length different from another one of the plurality of MOS transistors. In an embodiment, a third segment of the first MOS transistor and a fourth segment of the first MOS transistor have a shared source region or a shared drain region. The segments of the second MOS transistor may be sparsely distributed among segments of the first MOS transistor in some cases.

Figure 5:
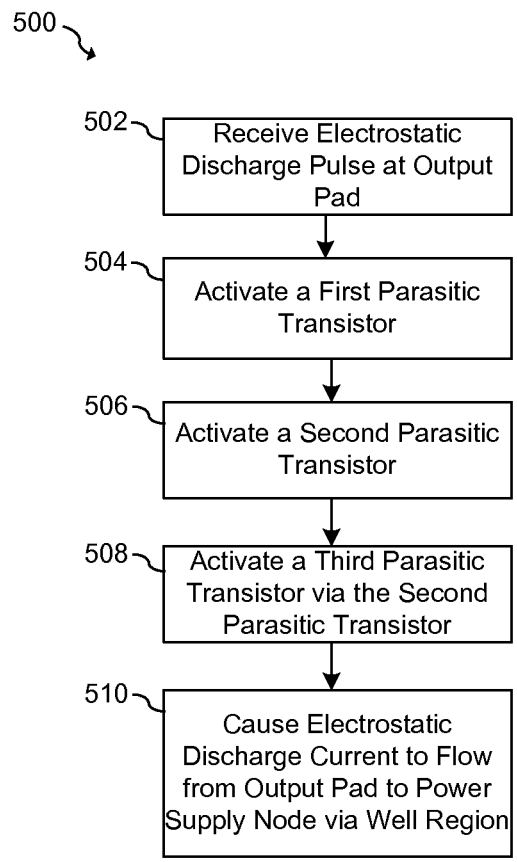
FIG. 5 illustrates an embodiment method.

FIG. 5 illustrates flowchart 500 of embodiment method 500 of operating an integrated circuit. Method 500 includes receiving an electrostatic discharge pulse at an output pad of the driver (step 502). The output driver includes a plurality of MOS transistors disposed in a well region, such that the plurality of MOS transistors have drain regions coupled to the output pad, source regions coupled to a power supply node, and gates coupled to a plurality of different corresponding gate input nodes. The plurality of MOS transistors are segmented into segments of a first width arranged in an array within the well region, and a first segment of a first MOS transistor of the plurality of MOS transistors and a second segment of a second MOS transistor of the plurality of MOS transistor are arranged adjacent to each other separated by a first distance. In step 504, a first parasitic transistor is activated. This first parasitic transistor has an emitter coupled to a drain region of a first segment of the first MOS transistor and a collector coupled to a source region to the first segment of the first MOS transistor. Method 500 further includes activating a second parasitic transistor having an emitter coupled to the drain region of the first segment and a collector coupled to a source region of the second segment disposed adjacent to the drain region of the first segment (step 506), and activating a third parasitic transistor via the second parasitic transistor (step 508). In an embodiment, the third parasitic transistor has an emitter coupled to a drain region of the second segment and a collector coupled to the source region of the second segment. Activating the first, second and third parasitic transistors further includes allowing an ESD current to flow between the output pad and the power supply node via the well region (step 510). In some embodiments, the integrated circuit may implement an adjustable strength output driver.

In an embodiment, the method further includes activating the first MOS transistor by changing a voltage of a first corresponding gate input node coupled to the first MOS transistor, and activating the second MOS transistor by changing a voltage of a second corresponding gate input node coupled to the second MOS transistor.

Advantages of some embodiment systems and methods include the ability to implement self-protecting variable strength drivers without the need of using additional ESD protection devices. As such, embodiment adjustable strength output drivers may consume less area than adjustable output drivers that utilize additional ESD protection devices. In addition, such embodiments may have improved speed and consume less leakage current than devices that use such additional ESD protection devices.

Further advantages of embodiments include improved ESD hardness due to a parasitic BJT that triggers adjacent driver devices, which provides a more homogeneous current flow through different devices connected to one pad in the case of an ESD even. Because multiple devices are triggered, multiple current filaments are created at the same time. Specific embodiments also provide for scalability and flexibility in layout and application. Moreover, no additional processing steps are required in some embodiments, thereby allowing for compatibility of the ESD devices with devices that may be available in the same process technology (e.g. CMOS).

A further advantageous aspect of embodiments includes the ability of forming arrays of transistor segments having various shapes. Variable shapes of the drivers coupled via substrate allow flexibility in the placement in the layout and/or circuit design While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit comprising:
    an output driver, wherein the output driver comprises
        a first transistor comprising a plurality of first transistor segments disposed in a well area, each first transistor segment comprising a first source region coupled to a power supply node, a first drain region coupled to a common output node, and a first gate region coupled to a first input node, and
        a second transistor comprising at least one second transistor segment, the at least one second transistor segment comprising a second source region coupled to the power supply node, a second drain region coupled to the common output node, and a second gate region coupled to a second input node different from the first input node, the at least one second transistor segment disposed in the well area such that an electrostatic discharge pulse applied to the common output node homogenously triggers parasitic bipolar devices coupled to each first drain region of the plurality of first transistor segments and the second drain region of the at least one second transistor segment.

2. The integrated circuit of claim 1, wherein
the second drain region of the at least one second transistor segment is disposed adjacent to the first source region of one of the plurality of first transistor segments; or
the second source region of the at least one second transistor segment is disposed adjacent to the first drain region of one of the plurality of first transistor segments.

3. The integrated circuit of claim 1, further comprising an output pad coupled to the common output node.

4. The integrated circuit according to claim 1, wherein:
the plurality of first transistor segments and the at least one second transistor segment comprise NMOS transistors;
the well area comprises a p-well;
the first drain region, first source region, second drain region and second source region comprises n+ regions; and
the power supply node comprises a ground node.

5. The integrated circuit according to claim 1, wherein:
the plurality of first transistor segments and the at least one second transistor segment comprise PMOS transistors;
the well area comprises a n-well; and
the first drain region, first source region, second drain region and second source region comprises p+ regions.

6. The integrated circuit of claim 1, further comprising a first guard ring surrounding the well area, wherein the first guard ring has a same conductivity type as the well area.

7. The integrated circuit of claim 6, wherein the first guard ring is coupled to the power supply node via a resistor having a resistance value between about 100 ohms and about 10 K ohms.

8. The integrated circuit of claim 1, wherein the plurality of first transistor segments have a different gate length from the at least one second transistor segment.

9. The integrated circuit of claim 1, further comprising at least one further second transistor segment, wherein the second transistor segments are sparsely distributed among the plurality of first transistor segments.

10. The integrated circuit of claim 9, wherein a third segment of the first transistor and a fourth segment of the first transistor have a shared source region or a shared drain region.

11. The integrated circuit of claim 1, further comprising a third transistor comprising at least one third transistor segment disposed in the well area adjacent to one of the plurality of first transistor segments, the third transistor segment having a third gate region coupled to a third input node different from the first and second input nodes, a third drain region coupled to the common output node, and a third source region coupled to the power supply node, wherein the first source region of the one of the plurality of first transistor segments is disposed next to the third drain region of the third transistor segment or the first drain region of the one of the plurality of first transistor segments is disposed next to the third source region.

12. The integrated circuit of claim 1, wherein the plurality of first transistor segments and the second transistor segment is arranged in an array having a dimension of one in a first direction and at least three in a second direction.

13. The integrated circuit of claim 1, further comprising at least one further second transistor segment, wherein the second transistor segments are randomly distributed among the plurality of first transistor segments.

14. A semiconductor circuit comprising:
a first transistor comprising a plurality of first transistor segments disposed in a well region, each of the first plurality of transistor segments comprising a first gate coupled to a first gate input node;
a first transistor segment of the plurality of first transistor segments disposed in the well region, the first transistor segment comprising a first source region coupled to a power supply node, and a first drain region coupled to a common output node;
a second transistor segment disposed in the well region, the second transistor segment comprising a second source region coupled to the power supply node, a second drain region coupled to the common output node and a second gate coupled to a second gate input node different from the first gate input node, wherein the second drain region of the second transistor segment is disposed adjacent to the first source region of the first transistor segment at a first distance; and
a third transistor segment disposed in the well region, the third transistor segment comprising a third source region coupled to the power supply node, a third drain region coupled to the common output node, wherein the third drain region of the third transistor segment is disposed adjacent to the second source region of the second transistor segment at a second distance.

15. The semiconductor circuit according to claim 14, wherein:
the third transistor segment is one of the plurality of first transistor segments; and
the third transistor segment further comprises a third gate coupled to a third gate input node, the third gate input node being different from the first and second gate input nodes.

16. The semiconductor circuit according to claim 14, wherein the plurality of first transistor segments and the second transistor segment are arranged in an array comprising at least two transistor segments by three transistor segments.

17. The semiconductor circuit according to claim 14, wherein a first transistor segment of the plurality of first transistor segments, the second transistor segment and the third transistor segment have a same first width.

18. The semiconductor circuit according to claim 14, wherein the first distance and the second distance are a same distance.

19. The semiconductor circuit according to claim 14, wherein the plurality of first transistor segments and the second transistor segment are arranged in an array having a first dimension of one and a second dimension of at least three.

20. An integrated circuit comprising:
an output pad;
a first MOS transistor disposed in a well region, the first MOS transistor segmented into a plurality of first transistor segments having drain regions coupled to the output pad, source regions coupled to a power supply node, and gate regions of a first width and a first length coupled to a first gate input node; and a second MOS transistor disposed in the well region, the second MOS transistor segmented into one or more second transistor segments having drain regions coupled to the output pad, source regions coupled to a power supply node, and gate regions of a second length coupled to a second gate input node, the plurality of first transistor segments and the one or more second transistor segments are arranged in an array within the well region, wherein the array comprises at least three transistor segments by three transistor segments, and the plurality of first transistor segments and the one or more second transistor segments are arranged with source regions adjacent to drain regions separated by a first distance.

21. The integrated circuit of claim 20, further comprising a gate control circuit coupled to the first gate input node and the second gate input node respectively.

22. The integrated circuit of claim 20, wherein:
the first width is between about 5 µm and about 10 µm; and
the first distance is between about 0.1 µm and about 10 µm.

23. The integrated circuit of claim 20, wherein the first MOS transistor and the second MOS transistor are NMOS transistors and the well region is a p-well region.

24. The integrated circuit of claim 20, wherein the first length different from the second length.

25. The integrated circuit of claim 20, wherein a third segment of the first MOS transistor and a fourth segment of the first MOS transistor have a shared source region or a shared drain region.

26. The integrated circuit of claim 20, wherein segments of the second MOS transistor are sparsely distributed among segments of the first MOS transistor.

27. A method of operating an integrated circuit comprising an output pad, and a plurality of MOS transistors disposed in a well region, the plurality of MOS transistors having drain regions coupled to the output pad and source regions coupled to a power supply node, and gates coupled to a plurality of different corresponding gate input nodes, wherein the plurality of MOS transistors are segmented into segments of a first length, the segments are arranged in an array within the well region, a first segment of a first MOS transistor of the plurality of MOS transistors and a second segment of a second MOS transistor of the plurality of MOS transistors are arranged adjacent to each other separated by a first distance, the method comprising:
receiving an electrostatic discharge pulse at the output pad;
activating a first parasitic transistor having an emitter coupled to a drain region of the first segment of the first MOS transistor, and a collector coupled to a source region of the first segment of the first MOS transistor;
activating a second parasitic transistor having an emitter coupled to the drain region of the first segment and a collector coupled to a source region of the second segment disposed adjacent to the drain region of the first segment; and
activating a third parasitic transistor via the second parasitic transistor, the third parasitic transistor having an emitter coupled to a drain region of the second segment and a collector coupled to the source region of the second segment, wherein the activating the first, second and third parasitic transistors further comprises allowing an ESD current to flow between the output pad and the power supply node via the well region.

28. The method of claim 27, further comprising:
activating the first MOS transistor by changing a voltage of a first corresponding gate input node coupled to the first MOS transistor; and
activating the second MOS transistor by changing a voltage of a second corresponding gate input node coupled to the second MOS transistor.

29. The method of claim 28, wherein:
the first MOS transistor comprises a plurality of first segments;
the second MOS transistor comprises a plurality of second segments; and
the second segments are sparsely distributed among the plurality of first segments.

30. The method of claim 28, wherein:
the first MOS transistor comprises a plurality of first segments;
the second MOS transistor comprises a plurality of second segments; and
the second segments are randomly distributed among the plurality of first segments.

31. The integrated circuit of claim 20, wherein segments of the second MOS transistor are randomly distributed among segments of the first MOS transistor.

32. An integrated circuit comprising:
a first transistor comprising a plurality of first transistor segments disposed in a well area, each first transistor segment comprising a first source region coupled to a power supply node, a first drain region coupled to a common output node, and a first gate region coupled to a first input node;
a second transistor comprising at least one second transistor segment, the at least one second transistor segment comprising a second source region coupled to the power supply node, a second drain region coupled to the common output node, and a second gate region coupled to a second input node different from the first input node, the at least one second transistor segment disposed in the well area such that an electrostatic discharge pulse applied to the common output node homogenously triggers parasitic bipolar devices coupled to each first drain region of the plurality of first transistor segments and the second drain region of the at least one second transistor segment; and
a third transistor comprising at least one third transistor segment disposed in the well area adjacent to a further first transistor segment of the plurality of first transistor segments, the third transistor segment having a third gate region coupled to a third input node different from the first and second input nodes, a third drain region coupled to the common output node, and a third source region coupled to the power supply node, wherein
the third drain region of the at least one third transistor segment is disposed adjacent to the first source region of the further one of the plurality of first transistor segments; or
the third source region of the at least one third transistor segment is disposed adjacent to the first drain region of the further one of the plurality of first transistor segments.

* * * * *